(12) United States Patent
Lai et al.

(10) Patent No.: US 6,452,221 B1
(45) Date of Patent: Sep. 17, 2002

(54) ENHANCEMENT MODE DEVICE

(75) Inventors: Richard Lai, Redondo Beach, CA (US); Ronald W. Grundbacher, Hermosa Beach, CA (US); Yaochung Chen, Rancho Palos Verdes, CA (US); Michael E. Barsky, Sherman Oaks, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/668,120

(22) Filed: Sep. 21, 2000

(51) Int. Cl.[7] ............... H01L 31/072; H01L 31/109; H01L 31/0328; H01L 31/0336
(52) U.S. Cl. ............... 257/192; 257/280; 257/281; 257/284
(58) Field of Search ............... 257/192, 194, 257/280, 281, 282, 283, 284

(56) References Cited

U.S. PATENT DOCUMENTS

| | | | | |
|---|---|---|---|---|
| 5,635,735 A | * | 6/1997 | Miyamoto et al. | 257/192 |
| 5,760,427 A | * | 6/1998 | Onda | 257/194 |
| 5,949,095 A | * | 9/1999 | Nagahara et al. | 257/192 |
| 6,144,048 A | * | 11/2000 | Suemitsu et al. | 257/192 |
| 6,242,766 B1 | * | 6/2001 | Tateno | 257/192 |
| 6,255,673 B1 | * | 7/2001 | Kuzuhara | 257/192 |
| 6,281,528 B1 | * | 8/2001 | Wada | 257/200 |
| 6,294,801 B1 | * | 9/2001 | Inokuchi et al. | 257/192 |

* cited by examiner

Primary Examiner—David Nelms
Assistant Examiner—Andy Huynh
(74) Attorney, Agent, or Firm—Harness, Dickey & Pierce, P.L.C.

(57) ABSTRACT

An enhancement mode FET device (10) that employs a strained N-doped InAlAs charge shield layer (22) disposed on an intrinsic InAlAs barrier layer (20). A gate metal electrode (38) of the FET device (10) is controllably diffused through a recess (36) into the shield layer (22) to the barrier layer (20). The resulting enhancement mode device (10) provides an excellent Schottky barrier with a high barrier height that inhibits undesirable surface depletion effects through charge shielding by the shield layer (22) in the regions between the recess edge and the gate metal. Minimizing surface depletion effects makes the device more robust by making the surface less sensitive to processing conditions and long-term operation effects.

10 Claims, 1 Drawing Sheet

ENHANCEMENT MODE DEVICE

BACKGROUND OF THE INVENTION

1. Field of the Invention

This invention relates generally to an enhancement mode semiconductor device and, more particularly, to an enhancement mode field effect transistor (FET) device that employs a strained N-doped InAlAs charge shield layer and an unintentionally doped InAlAs barrier layer that act to minimize depletion effects on the surface of the device.

2. Discussion of the Related Art

High performance and reliable enhancement mode semiconductor devices, such as enhancement mode field effect transistor (FET) devices, are used for many circuit applications, including analog-to-digital converters, digital FETs, power FETs and cryogenic low noise devices. An enhancement mode FET device is a normally-off device. A normally-off device is a device that does not allow current flow between the source and drain terminals of the FET device when no voltage is applied to the gate terminal. Enhancement mode devices are different in this regard than depletion mode FET devices, which require a potential applied to the gate terminal to allow current flow through the channel between the source terminal and the drain terminal. Enhancement mode FET devices are advantageous in circuit applications because a separate power source for the gate terminal is not required. Depletion mode devices require an additional negative potential applied to the gate terminal for operation. Additionally, enhancement mode FET devices provide higher gain than depletion mode devices.

Conventional methods of fabricating enhancement mode FET devices include etching a relatively deep recess in the device where the gate electrode is deposited and/or diffused into the device. This deep etch positions the gate electrode very close to the FET channel which typically results in electrons tunneling from the gate electrode to the channel. This tunneling reduces control of the device and causes a lower breakdown voltage which results in performance limitations of the enhancement mode FET device. Also, the gate deposition process is inherently uncontrolled because the placement of the gate electrode relative to the channel is dependent upon a wet chemical etchant of varying etching uniformity. Thus, the Schottky barrier height resulting from this process is poor, and the device is subject to deleterious surface depletion effects due to the deep recess.

A new FET device structure needs to be developed to produce a high performance and reliable enhancement mode device that does not suffer from surface depletion effects. It is therefore an object of the present invention to provide such a device structure.

SUMMARY OF THE INVENTION

In accordance with the teachings of the present invention, an enhancement mode FET device is disclosed that employs a strained N-doped InAlAs charge shield layer disposed on an intrinsic InAlAs barrier layer. The gate metal electrode of the FET device is controllably diffused through a recess into the shield layer to the barrier layer. The resulting enhancement mode device provides an excellent Schottky barrier with a high barrier height that inhibits undesirable surface depletion effects by charge shielding from the shield layer in the adjacent regions between the recess edge and the gate electrode. Minimizing surface depletion effects makes the device more robust by making the surface less sensitive to processing conditions and long-term operation effects.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to an enhancement mode FET device having a charge shield layer and a barrier layer is merely exemplary in nature, and is in no way intended to limit the invention or its applications or uses.

Figure 1:
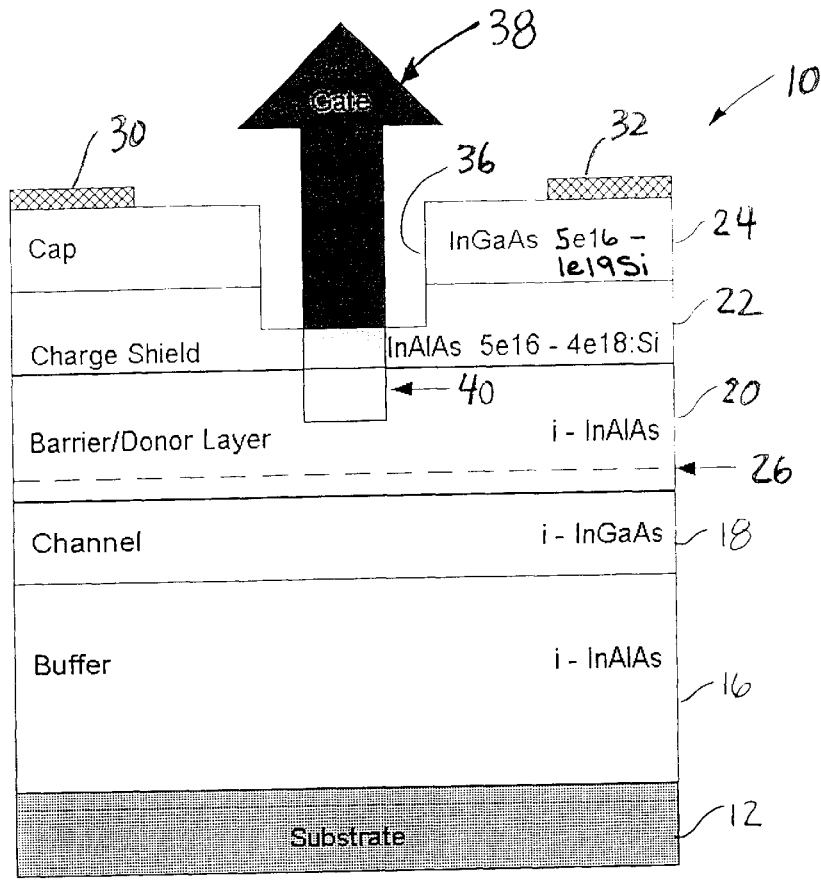
FIG. 1 is a cross-sectional view of an enhancement mode FET device having a surface charge shield layer and a barrier layer, according to an embodiment of the present invention.
Figure 2:
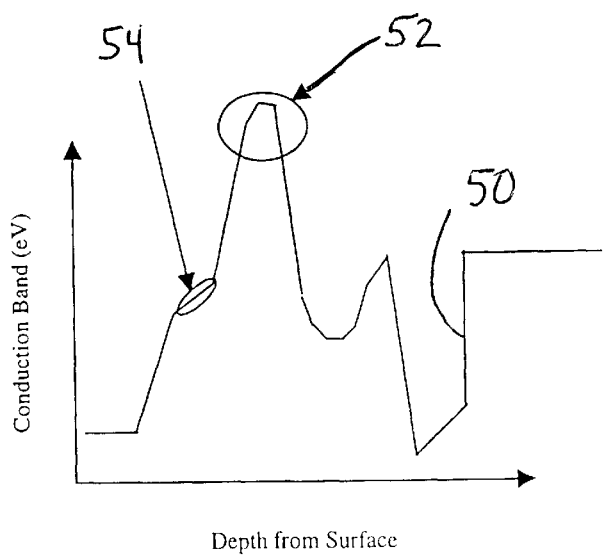
FIG. 2 is a conduction band energy diagram of the enhancement mode FET device shown in FIG. 1.

FIG. 1 is a cross-sectional view of an enhancement mode FET device 10, according to an embodiment of the present invention. FIG. 2 is a conduction energy band diagram of the device 10. The enhancement mode device 10 includes a substrate layer 12 on which are deposited the various semiconductor layers discussed herein. The deposition process of the various semiconductor layers can be provided by any suitable semiconductor deposition process, such as molecular beam epitaxy, as would be appreciated by those skilled in the art.

The semiconductor layers include a buffer layer 16 deposited on the substrate 12, a channel layer 18 deposited on the buffer layer 16, an unintentionally doped donor or barrier layer 20 deposited on the channel layer 18, a lightly doped charge shield layer 22 deposited on the barrier layer 20, and a heavily doped cap layer 24 deposited on the shield layer 22. A heavily doped layer 26 is provided in the barrier layer 20 adjacent to the channel layer 18, and provides the source of electrons to make the device 10 a modulation doped FET or a high election mobility transistor (HEMT). In one embodiment, the buffer layer 16 is an intrinsic InAlAs layer, the channel layer 18 is an intrinsic InGaAs layer, the barrier layer 20 is an intrinsic InAlAs layer, the charge shield layer 22 is an InAlAs layer lightly doped with silicon and having a thickness between 50–200 Å, the cap layer 24 is an InGaAs layer heavily doped with silicon, and the doped layer 26 is a silicon doped layer. However, as will be appreciated by those skilled in the art, other semiconductor materials can be used within the scope of the present invention.

The device 10 includes a metal source terminal 30 and a metal drain terminal 32 deposited on the cap layer 24. The cap layer 24 is highly doped to provide ohmic contact to the source terminal 30 and the drain terminal 32. A recess 36 is etched through the cap layer 24 and into the charge shield layer 22. A gate electrode 38 is deposited in the recess 36, where a diffusion portion 40 of the gate electrode 38 diffuses into the charge shield layer 22 and the barrier layer 20, as shown. In one embodiment, the gate electrode 38 includes a bottom platinum layer, middle titanium and platinum layers and a top gold layer, where the bottom platinum layer controls the diffusion of the portion 40 of the gate electrode 38. The proximity of the gate electrode 38 to the channel layer 18 determines whether the device 10 is an enhancement mode device. The portion 40 makes the gate electrode 38 closer to the channel layer 18.

Electrons in the channel layer 18 exist in the energy levels in the well 50 shown in FIG. 2. Electrons are lost by tunneling from the well 50 to the surface of the device 10, which limits device performance. The bottom of the portion 40 is represented at area 52 in the conduction band energy diagram. The shield layer 22, represented at area 54 in FIG. 2, provides a barrier layer between the surface of the device 10 at the recess 36 and the channel layer 18 that prevents the electrons in the channel layer 18 from tunneling to the surface. Thus, the shield layer 22 prevents biases on the surface of the device 10 from affecting the electrons in the channel layer 18. In other words, by providing the lightly doped shield layer 22 between the surface of the device 10 and the channel layer 18, the charge on the surface is imaged by the charge in the shield layer 22 and electrons in the channel layer 18 will not be effected by holes on the surface of the device 10. Therefore, the shield layer 22 protects the channel layer 18 from depletion effects caused by charge on the surface of the device 10.

The portion 40 of the gate electrode 38 is controllably diffused through the shield layer 22 to the barrier layer 20. This provides an excellent Schoftky barrier with a high barrier height that inhibits undesirable surface depletion effects through charge shielding from the shield layer 22 in the adjacent regions between the recess edge and the gate metal. Minimizing surface depletion defects makes the device 10 more robust by making the surface less sensitive to processing conditions and long-term operation effects.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. An semiconductor device comprising:

a substrate layer;

a channel layer deposited on the substrate layer;

a barrier layer deposited on the channel layer, the barrier layer being comprised of a first material;

a charge shield layer deposited on the barrier layer, the charge shield layer being an N-doped layer of the first material; and an ohmic contact layer deposited on the charge shield layer, said ohmic contact layer being etched to form a recess that extends into the charge shield layer, such that a remaining portion of said charge shield layer providing a charge barrier between a surface of the device within the recess and the channel layer; and a gate electrode deposited into the recess onto the remaining portion of said charge shield layer, a portion of the gate electrode diffused through the charge shield layer into the barrier layer.

2. The semiconductor device according to claim 1 wherein the gate electrode includes a first platinum layer, a titanium layer, a second platinum layer and a gold layer, said first platinum layer being diffused into the charge shield layer.

3. The semiconductor device according to claim 1 wherein the barrier layer is an InAlAs layer.

4. The semiconductor device according to claim 1 wherein the barrier layer is an intrinsic layer.

5. The semiconductor device according to claim 1 wherein the charge shield layer is an N-doped InAlAs layer.

6. The semiconductor device according to claim 1 further comprising a buffer layer deposited on the substrate between the channel layer and the substrate.

7. The semiconductor device according to claim 1 wherein the device is an enhancement mode field effect transistor device.

8. An enhancement mode field effect transistor (FET) device comprising:

a substrate layer;

an InGaAs channel layer deposited on the substrate layer;

an intrinsic InAlAs barrier layer deposited on the channel layer;

a lightly doped InAlAs shield layer deposited on the barrier layer;

a heavily doped InGaAs ohmic contact layer deposited on the charge shield layer, said ohmic contact layer being etched to form a recess that extends into the charge shield layer; and a gate electrode deposited into the recess, a portion of the gate electrode being diffused through the shield layer into the barrier layer, such that a portion of said charge shield layer providing a charge barrier between a surface of the device in the recess and the channel layer.

9. The FET device according to claim 8 wherein the gate electrode includes a first platinum layer, a titanium layer, a second platinum layer and a gold layer, wherein the first platinum layer is diffused into the shield layer.

10. The FET device according to claim 8 further comprising a buffer layer deposited on the substrate between the channel layer and the substrate.

* * * * *